(12) United States Patent
Stoddard

(10) Patent No.: US 8,882,077 B2
(45) Date of Patent: Nov. 11, 2014

(54) SEED LAYERS AND PROCESS OF MANUFACTURING SEED LAYERS

(75) Inventor: Nathan G. Stoddard, Gettysburg, PA (US)

(73) Assignee: AMG Idealcast Solar Corporation, Wayne, PA (US)

( * ) Notice: Subject to any disclaimer, the term of this patent is extended or adjusted under 35 U.S.C. 154(b) by 1206 days.

(21) Appl. No.: 12/695,193

(22) Filed: Jan. 28, 2010

(65) Prior Publication Data

US 2010/0193664 A1    Aug. 5, 2010

Related U.S. Application Data

(60) Provisional application No. 61/148,469, filed on Jan. 30, 2009.

(51) Int. Cl.

| | | |
|---|---|---|
| *C01B 33/02* | (2006.01) |
| *B29C 65/02* | (2006.01) |
| *B29C 65/16* | (2006.01) |
| *B29C 65/14* | (2006.01) |
| *C30B 25/02* | (2006.01) |
| *C30B 25/20* | (2006.01) |
| *B32B 38/10* | (2006.01) |
| *C30B 11/14* | (2006.01) |
| *C30B 29/06* | (2006.01) |
| *B28B 7/36* | (2006.01) |
| *C30B 28/04* | (2006.01) |
| *C30B 28/06* | (2006.01) |

(52) U.S. Cl.
CPC .................. *C30B 11/14* (2013.01); *C30B 28/04* (2013.01); *C30B 28/06* (2013.01); *C30B 29/06* (2013.01)

USPC .......... 249/114.1; 117/88; 117/103; 117/108; 117/1; 156/304.1; 156/304.6; 156/274.4; 156/274.6; 156/272.6; 156/221; 156/272.2; 156/154; 264/261; 423/348

(58) Field of Classification Search
CPC ............. C30B 7/00; C30B 11/14; C30B 29/06
USPC ........................................ 117/1, 88, 103, 108
See application file for complete search history.

(56) References Cited

U.S. PATENT DOCUMENTS

| | | | |
|---|---|---|---|
| 5,363,799 A | 11/1994 | Yonehara et al. | 117/94 |
| 5,443,032 A | 8/1995 | Vichr et al. | 117/84 |

(Continued)

FOREIGN PATENT DOCUMENTS

| | | |
|---|---|---|
| DE | 19833755 A1 | 1/2000 |
| EP | 0 887 442 | 6/1998 |

(Continued)

*Primary Examiner* — Michael Kornakov
*Assistant Examiner* — Hua Qi
(74) *Attorney, Agent, or Firm* — Barnes & Thornburg LLP; Thomas J. McWilliams; Edward F. Behm, Jr.

(57) ABSTRACT

This invention relates seed layers and a process of manufacturing seed layers for casting silicon suitable for use in solar cells or solar modules. The process includes the step of positioning tiles with aligned edges to form seams on a suitable surface, and the step of joining the tiles at the seams to form a seed layer. The step of joining includes heating the tiles to melt at least a portion of the tiles, contacting the tiles at both ends of at least one seam with electrodes, using plasma deposition of amorphous silicon, applying photons to melt a portion of the tiles, and/or layer deposition. Seed layers of this invention include a rectilinear shape of at least about 500 millimeters in width and length.

26 Claims, 2 Drawing Sheets

(56) References Cited

U.S. PATENT DOCUMENTS

| | | | |
|---|---|---|---|
| 5,471,944 A | 12/1995 | Sato | 117/84 |
| 6,072,118 A | 6/2000 | Fukuda et al. | 136/258 |
| 6,106,617 A * | 8/2000 | Yatsurugi | 117/214 |
| 6,913,646 B2 | 7/2005 | Sakurada et al. | 117/13 |
| 2003/0029376 A1 | 2/2003 | Snyder et al. | 117/105 |
| 2003/0089300 A1 | 5/2003 | Hoshi et al. | 117/13 |
| 2007/0169684 A1* | 7/2007 | Stoddard | 117/13 |
| 2007/0169685 A1 | 7/2007 | Stoddard | 117/13 |
| 2008/0156254 A1* | 7/2008 | Dwilinski et al. | 117/1 |
| 2008/0295885 A1* | 12/2008 | Lee | 136/256 |
| 2010/0003183 A1 | 1/2010 | Servant et al. | 423/349 |

FOREIGN PATENT DOCUMENTS

| | | |
|---|---|---|
| FR | 2 908 125 | 11/2006 |
| JP | 11079883 | 3/1999 |
| JP | 2000021792 | 1/2000 |
| JP | 2000327487 | 11/2000 |
| WO | WO 84/04935 | 12/1984 |
| WO | WO 01/68957 | 9/2001 |
| WO | WO 2009/014961 | 1/2009 |
| WO | WO 2009/015168 | 1/2009 |

* cited by examiner

SEED LAYERS AND PROCESS OF MANUFACTURING SEED LAYERS

This application claims the benefit of priority from U.S. Provisional Patent Application 61/148,469, filed Jan. 30, 2009, the entirety of which is expressly incorporated herein by reference.

BACKGROUND

1. Technical Field

This invention relates to seed layers and a process of manufacturing seed layers for casting silicon suitable for use in solar cells or solar modules.

2. Discussion of Related Art

Known steps to prepare seed material for silicon casting use a monocrystalline boule of silicon prepared by the Czochralski (CZ) technique or the float zone (FZ) technique. Both CZ and FZ techniques produce round or circular boules of material. The round boule is cut down to a square or rectangular cross-section and then sliced into pieces for the seed material. The conventional CZ and FZ techniques produce boules of up to a few hundred millimeters with very large boules being about 300-450 millimeters in diameter. Squaring the boule and slicing the seed material results in a square of about 210 millimeters per side from a 300 millimeter diameter boule. The resulting seed material covers less than 50 percent of a bottom of a crucible used in directional solidification.

Without excessive care, loosely abutted seed tiles will tend to form highly defective crystal areas both in the fused seed layer and in the grown ingot above. These highly defective areas grow and become problematic for the solar cells produced from the material, typically resulting in a lower solar cell efficiency.

There is a need and a desire to produce seed layers corresponding in size to larger crucibles used for directional solidification. There is a need and a desire to produce monolithic seed layers that do not break during normal handling and can be used during several casting cycles. There is a need and a desire to form substantially defect free seed layers at significantly larger scales. There is also a need and a desire to lower the cost per unit volume of cast crystalline silicon by increasing a volume of cast silicon produced.

SUMMARY

This invention describes seed layers and relates a process of manufacturing seed layers for casting silicon suitable for use in solar cells or solar modules. Desirably, the process produces a high purity crystalline structure to create a robust high quality seed plate for use in silicon casting processes. This invention may include a process to produce seed layers corresponding in size to larger crucibles used for directional solidification. This invention may also include a process to produce monolithic seed layers that do not break during normal handling and can be used during several casting cycles. This invention may also include a process to lower the cost per unit volume of cast crystalline silicon by increasing a volume of cast silicon produced. The optimal application of the techniques disclosed here will result in defect-free or nearly defect-free seed crystals for large-area seeding.

According to one embodiment, this invention relates a process for manufacturing seed layers for casting silicon suitable for use in solar cells or solar modules. The process includes the step of positioning tiles with aligned edges to form seams on a suitable surface, and the step of joining the tiles at the seams to form a seed layer.

The joining step may include several embodiments, such as heating the tiles to melt at least a portion of the tiles, or contacting the tiles at both ends of at least one seam with electrodes. The joining step also may include plasma deposition of amorphous silicon, or applying photons. The joining step also may include layer deposition, such as oxidation, chemical vapor deposition, liquid phase solution deposition, plasma-enhanced deposition, molecular beam epitaxy, and/or the like.

According to a second embodiment, this invention includes a seed layer made by the steps of any of the processes or techniques of this invention.

According to a third embodiment, this invention includes a seed layer for casting silicon suitable for use in solar cells or solar modules. The seed layer includes a rectilinear shape of at least about 500 millimeters in width and length.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention. In the drawings.

DETAILED DESCRIPTION

Figure 1:
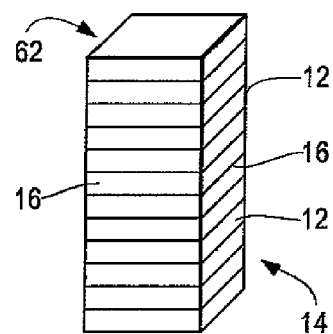
FIG. 1 illustrates a block cut to make seed tiles, according to one embodiment.

This invention describes seed layers and relates a process of manufacturing seed layers for casting silicon suitable for use in solar cells or solar modules. Directional solidification of silicon can allow the use of larger crucibles and larger scale manufacturing than known Czochralski or Float Zone techniques. Directional solidification may include using a seed crystal or seed layer to orient crystal growth, such as placing the seed layer on one more surfaces of the crucible or vessel. Accordingly, directional solidification can benefit from use of a very large single crystal seed layers. The seed layers can be any suitable size, such as at least about 500 millimeters squared, at least about 630 millimeters squared, at least about 750 millimeters squared, at least about 950 millimeters squared, and/or the like. Desirably, the seed crystal can be reused multiple times for several batches, such as by cutting the seed layer from the bottom of an ingot and placing the seed layer on a bottom of a crucible for the next batch.

According to one embodiment, a seed layer can be assembled from smaller single crystal pieces, typically grown using Czochralski or Float Zone techniques. These pieces can be sized to a rectilinear shape, etched to remove damage or impurities, and abutted as closely as possible to form the seed layer for an initial casting. The abutment may include surface roughness induced in the preparation. In another embodiment, a thin layer of seeds may be abutted with a second thicker layer on top, where the upper seeds may be aligned but not abutted, with a well-controlled gap between the pieces. A grinding process may help reduce surface roughness and improve the intimacy of abutment. Small gaps between seed pieces can tend to form a jagged and/or defective boundary upon the first casting. The boundary may not improve with future castings.

Furthermore, the seed layer made from loose pieces generally only fuses to the depth of maximum melting, such as from about 2 millimeters to about 2 centimeters across a depth of the seed layer. Unfused portions of the original edges of the seed pieces can make weak points or score lines that may tend to crack the seed layer in the course of subsequent normal handling.

According to one embodiment, this invention may include a process for the production of a single, robust piece of silicon (either single crystal or geometric multicrystalline) for use as a seed layer in a cast ingot. The process may include fusing smaller pieces of single crystal silicon grown by the Czochralski technique, the Float Zone technique or other suitable casting methods. The first step in the process includes seed preparation or seed tile preparation. Desirably, a Czochralski boule or a Float Zone boule can be cut into a square cross section, such as to form the tile. The sides of the tile or block can be polished or finely ground to a high precision finish in order to minimize inter-seed spacing.

The joining steps or process can take one of several forms. A first joining option may include melting parts of the seed layer. The seed tiles can be abutted carefully to form a single layer of silicon with a minimum of spacing between pieces to form a seam. The seed tiles can be placed on a suitable surface, such as on a fused silica plate, inside a crucible, on top of a layer of fused silica beads, on top of a layer of fused silica powder, on a silicon seed layer, and/or the like. Optionally, the suitable surface may include a release coating applied to it, such as silicon nitride, silicon carbide, and/or the like. The suitable surface with the abutted seed tiles may be placed in a furnace or oven for heating or firing. Desirably, the heating occurs under an argon environment or other suitable inert atmosphere. The silicon tiles can be heated to the melting point of the silicon (about 1,414 degrees Celsius). Desirably, at least the top of the seed tiles, and potentially the bottom of the seed tiles, melt to fuse the tiles and form a seed layer. The seed layer can be cooled or slowly cooled, such as to allow crystal growth. Optionally the seed layer can be flipped or turned over. The heating process and the cooling process may be repeated on the flipped over seed layer.

A second joining option may include direct electric melting. The seed tiles can be closely abutted to form a seam. High current electrodes (preferably with highly doped silicon ends) can be attached to both ends of the seam and contact both pieces of silicon tile on either side of the seam. Electrical current can run through electrodes and the silicon tiles along the seam, such as until a portion of the seam melts. Desirably, the conductivity of silicon increases with temperature so the melting zone focuses narrowly along the current path. Optionally, the tiles can be placed in an argon environment or under another suitable inert or controlled atmosphere. The electrical current can be stopped and another seam fused in the same manner until all seams have been completed. Direct electric melting may weld or fuse the seed tiles together without melting the entire seed layer. The seed layer can be cooled or slowly cooled, such as to allow controlled crystal growth and/or defect-free cooling.

A third joining option may include amorphous silicon deposition. Sides of a block of seed material may be deposited with amorphous silicon before being cut into tiles or pieces. The tiles can be closely abutted to form a seam. Optionally, the process may include conformal plasma deposition of amorphous silicon after the seed tiles have been cut and/or laid together. Slight and/or suitable pressure can be applied to provide contact between the different tiles or pieces. The entire seed layer can be heated to a temperature of about 550 degrees Celsius to about 600 degrees Celsius to fuse together the amorphous layers and to crystallize the amorphous layers, such as by solid phase epitaxy. An additional heat treatment step may involve a higher temperature anneal or provide heat treatment, such to remove oxygen at the interfaces. The seed layer can be cooled or slowly cooled, such as to prevent or reduce the formation of stress-induced defects. Stress-induced defects may include dislocations and/or slip lines.

A fourth joining option may include melting by applying photons. The seed tiles or pieces can be abutted together to form seams. The seed tiles may be fused together at the seams, such as by laser melting, targeted (localized) flash lamp melting, and/or the like. If necessary, the seed layer can be cooled or slowly cooled, such as to prevent the formation of stress-induced defects.

A fifth joining option may include epitaxial deposition. The seed tiles or pieces can be abutted together to form seams. Epitaxial deposition of silicon at high temperature (about 800 degrees Celsius to about 900 degrees Celsius) can be used to fuse the seams of the seed tiles together. Optionally, high pressure plasma assisted deposition can be used to increase the conformality or uniformity of the deposition. The seed layer can be cooled or slowly cooled, such as to prevent the formation of stress-induced defects.

According to one embodiment this invention may include various methods for fusing separate tiles or pieces of silicon or other semiconductor material into a single piece, such as for a seed layer for crystal growth. The scope of this invention may include the use of targeted melting and material deposition methods to fuse together pieces of silicon.

FIG. 1 shows a block 14 for seed tiles 12, according to one embodiment. The block 14 may be cut into the seed tiles 12. The seed tiles 12 include edges 16 and may include a rectilinear shape 62. The edges 16 may be polished, tapered, and/or deposited with amorphous silicon.

Figure 2:
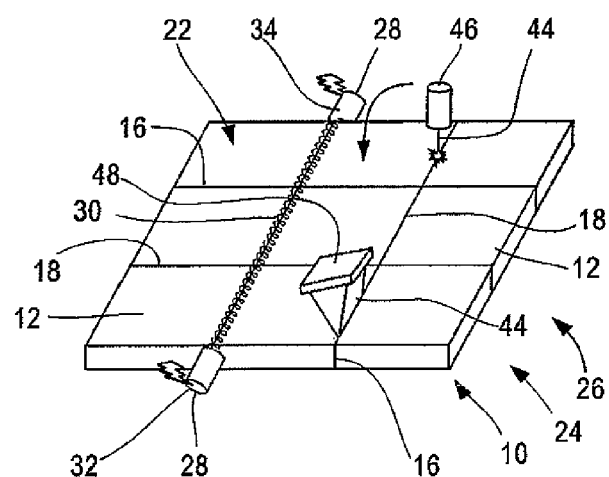
FIG. 2 illustrates a matrix of seed tiles, according to one embodiment.

FIG. 2 shows a matrix 26 of seed tiles 12 to form a seed layer 10, according to one embodiment. The tiles 12 include edges 16 which can be abutted or placed together to form seams 18. The seed layer 10 includes a top 22 and a bottom 24. The tiles 12 may be combined or fused at the seam 18 by electrodes 28. The electrodes 28 pass electric current 30 down, across, and/or along a seam 18. The electrodes 28 may include a stationary electrode 32 and a moving electrode 34 as in a direction indicated by the nearby arrow. In the alternative, the tiles 12 may be combined or fused at the seams 18 by photons 44. The photons 44 may be applied by a laser 46 or a flash lamp 48.

Figure 3:
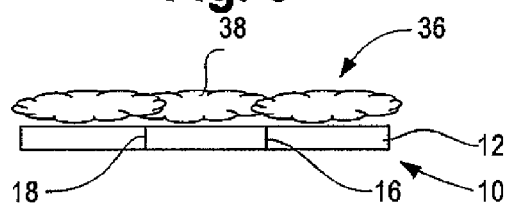
FIG. 3 illustrates a deposition process, according to one embodiment.

FIG. 3 shows a deposition process 36, according to one embodiment. The seed layer 10 includes tiles 12 with edges 16 forming seams 18. The deposition process 36 may include a cloud 38, such as for chemical vapor deposition.

Figure 4:
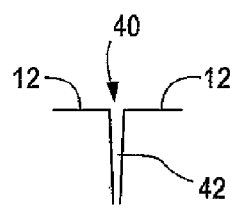
FIG. 4 illustrates a tile gap, according to one embodiment.

FIG. 4 shows a tile gap 42, according to one embodiment. The tiles 12 may include tapering 40 to form the gap 42.

Figure 5:
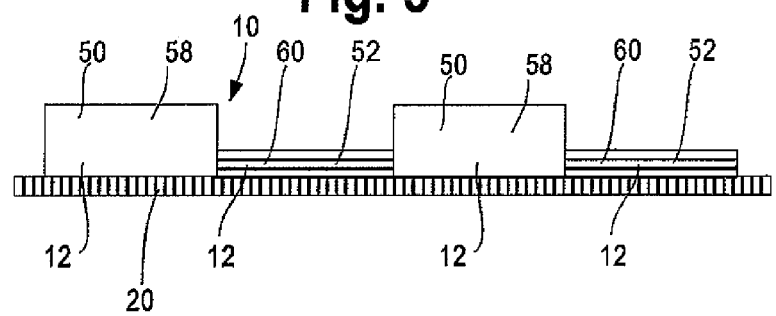
FIG. 5 illustrates a seed layer, according to one embodiment.

FIG. 5 shows a seed layer 10, according to one embodiment. The seed layer 10 or tiles 12 may be placed on a suitable surface 20. The seed layer may include thick tiles 50 alternating with thin tiles 52. Optionally and/or in the alternative, the seed layer 10 may include tiles 12 with a first crystal orientation 58 and a second crystal orientation 60, such as alternating.

Figure 6A:
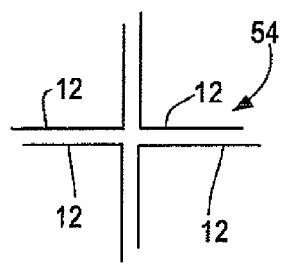
FIG. 6A illustrates a four corner seam junction, according to one embodiment.

FIG. 6A shows a four corner seam junction 54, according to one embodiment. The tiles 12 may form a four corner seam junction 54, where all four tiles 12 have corners connecting at a single point.

Figure 6B:
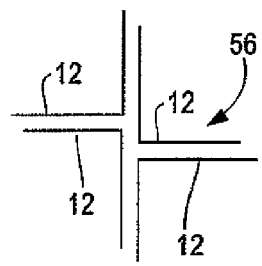
FIG. 6B illustrates a staggered seam junction, according to one embodiment.

FIG. 6B shows a staggered seam junction 56, according to one embodiment. The tiles 12 may form a staggered seam junction 56, where two tiles 12 form a first point and two other tiles 12 form a second point. Junctions with more than two points are within the scope of this invention.

Figure 7A:
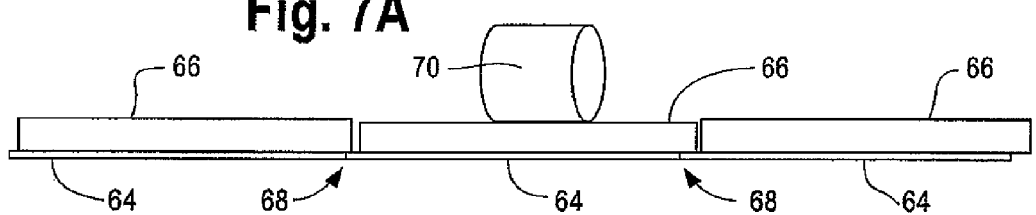
FIG. 7A illustrates a layered arrangement of tiles, according to one embodiment.
Figure 7B:
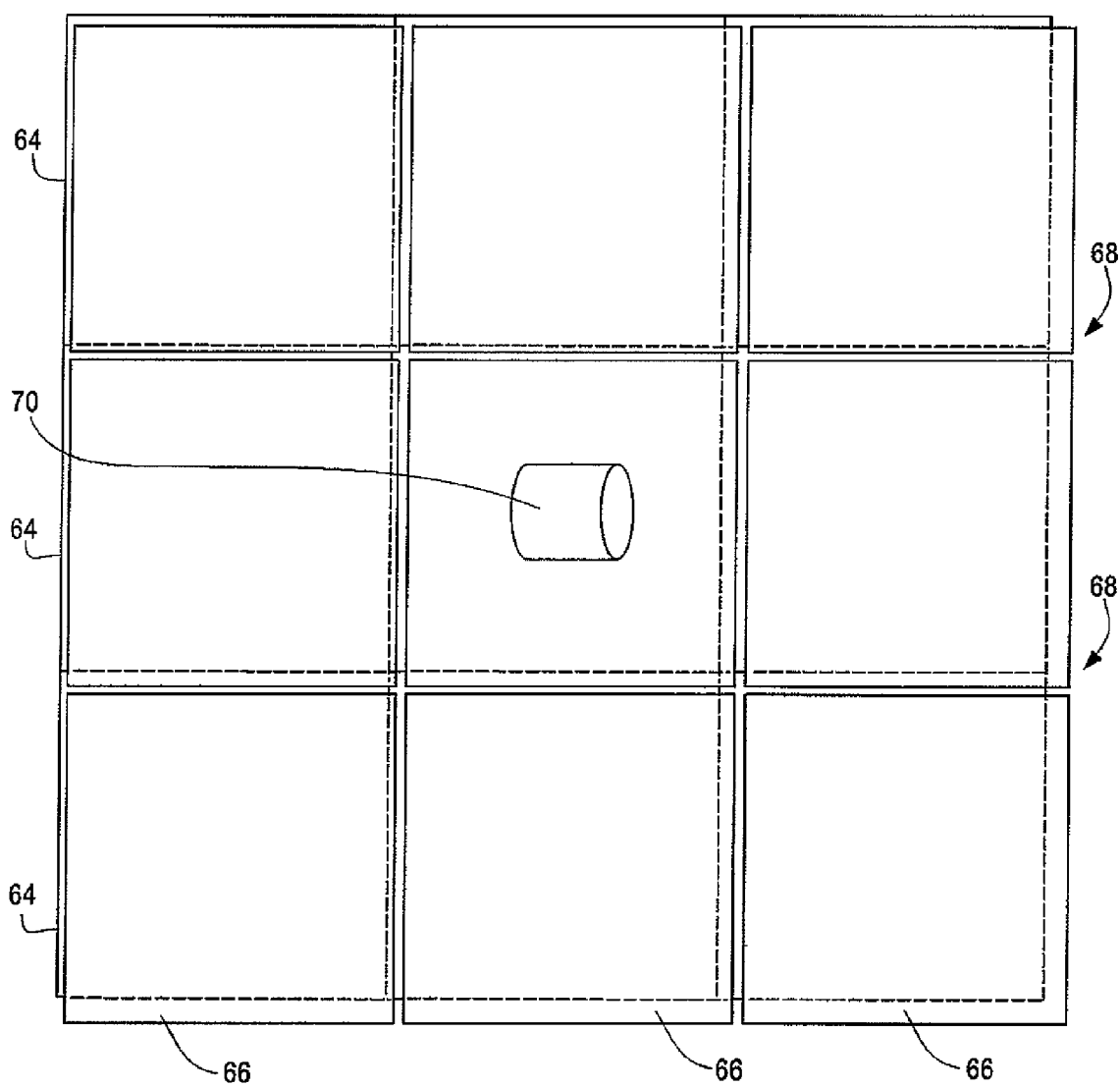
FIG. 7B illustrates a top view of the arrangement of FIG. 7A, according to one embodiment.

FIG. 7A shows a side sectional view of a layered arrangement of tiles, according to one embodiment. The arrangement includes a bottom of thin blocks 64 with thicker blocks 66 placed over top the thin blocks 64 to form an offset seam 66 (the gaps of each layer do not align). A piece of feedstock 70, such as polycrystalline silicon, can be placed on top of the arrangement before processing or heating into a seed layer. Desirably, the thin blocks 64 can provide a surface and/or a crystallization pattern for the material to fill in the offset seam 68. FIG. 7B shows a top view of the arrangement of FIG. 7A, according to one embodiment. The arrangement includes thin blocks 64, thick blocks 66, offset seams 68, and the feedstock 70.

Figure 7C:
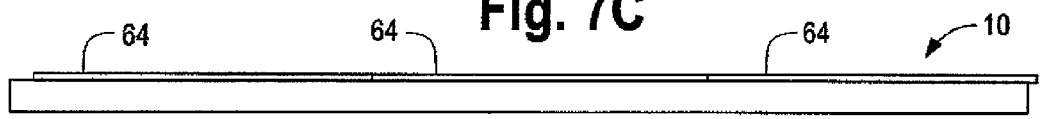
FIG. 7C illustrates a seed layer made from the arrangement of FIG. 7A, according to one embodiment.

FIG. 7C shows a seed layer 10 made from the arrangement of FIG. 7A, according to one embodiment. The seed layer 10 can be formed after processing the melted feedstock 70 (not shown) to fill the gaps of the offset seam 68 and form a low defect single crystal. The seed layer 10 can be flipped or turned over for first or initial use as a seed, such as where the thin blocks 64 may be melted with the material for the ingot.

Moreover, although seed layers of silicon have been described herein, other semiconductor materials and nonmetallic crystalline materials may be prepared without departing from the scope and spirit of the invention. For example, the inventors have contemplated seed layers of other materials consistent with embodiments of the invention, such as germanium, gallium arsenide, silicon germanium, aluminum oxide (including its single crystal form of sapphire), gallium nitride, zinc oxide, zinc sulfide, gallium indium arsenide, indium antimonide, germanium, yttrium barium oxides, lanthanide oxides, magnesium oxide, calcium oxide, and other semiconductors, oxides, and intermetallics with a liquid phase. In addition, a number of other group III-V or group II-VI materials, as well as metals and alloys, could be prepared according to embodiments of the present invention.

Seed layers may include amorphous silicon, multicrystalline silicon, near multicrystalline silicon, geometric multicrystalline silicon, and/or monocrystalline silicon. Multicrystalline silicon refers to crystalline silicon having about a centimeter scale grain size distribution, with multiple randomly oriented crystals located within a body of multicrystalline silicon.

Geometric multicrystalline silicon or geometrically ordered multicrystalline silicon refers to crystalline silicon having a nonrandom ordered centimeter scale grain size distribution, with multiple ordered crystals located within a body of multicrystalline silicon. The geometric multicrystalline silicon may include grains typically having an average about 0.5 centimeters to about 5 centimeters in size and a grain orientation within a body of geometric multicrystalline silicon can be controlled according to predetermined orientations, such as using a combination of suitable seed crystals.

Polycrystalline silicon refers to crystalline silicon with micrometer to millimeter scale grain size and multiple grain orientations located within a given body of crystalline silicon. Polycrystalline silicon may include grains typically having an average of about submicron to about micron in size (e.g., individual grains are not visible to the naked eye) and a grain orientation distributed randomly throughout.

Monocrystalline silicon refers to crystalline silicon with very few grain boundaries since the material has generally and/or substantially the same crystal orientation. Monocrystalline material may be formed with one or more seed crystals, such as a piece of crystalline material brought in contact with liquid silicon during solidification to set the crystal growth. Near monocrystalline silicon refers to generally crystalline silicon with more grain boundaries than monocrystalline silicon but generally substantially fewer than multicrystalline silicon.

According to one embodiment, this invention may include a process for manufacturing seed layers for casting silicon suitable for use in solar cells or solar modules. The process may include the step of positioning tiles with aligned edges to form seams on a suitable surface, and the step of joining the tiles at the seams to form a seed layer.

Casting silicon broadly refers to any suitable process to melt and solidify at least a portion of the feedstock. Casting may include crystal growth and/or orientation into one or more of the above described materials. Optionally, casting may include refining or purifying steps.

Seed layer broadly refers to an object or a piece of material suitable for use in the casting process, such as to orient crystal growth. Seed layers may be placed in any suitable location, such as on a bottom of a crucible, a side of a crucible, contact a molten surface from above, and/or the like. The seed layer may include any suitable size and/or shape. Desirably, the seed layer may at least substantially cover or fill a surface that it is placed over. In the alternative, the seed layer covers only a suitable portion of the surface it is placed over, such as at least about 20 percent, at least about 40 percent, at least about 60 percent, at least about 80 percent, and/or the like.

The seed layer may include a width, a length, or a radius of at least about 300 centimeters, at least about 400 centimeters, at least about 500 centimeters, at least about 600 centimeters, at least about 700 centimeters, at least about 750 centimeters, at least about 800 centimeters, at least about 900 centimeters, at least about 1,000 centimeters, at least about 1,200 centimeters, and/or the like.

The seed layer may include any suitable thickness, such between about 1 millimeter and about 100 millimeters, between about 2 millimeters to about 50 millimeters, about 10 millimeters, and/or the like.

The seed layer may include any suitable shape, such as a circle, a triangle, a rectangle, a square, a pentagon, a hexagon, an octagon, a polygon, a rectilinear shape, an arcuate shape, a symmetric shape, an irregular shape, and/or the like. Desirably, the seed layer corresponds to a shape or surface that it will be placed into or against for casting.

Positioning broadly refers to placing, locating, laying out, arranging, and/or the like. Tiles broadly refer to pieces or parts of suitable seed material. Tiles may have any suitable size and/or shape. Different tiles may have the same or different composition and/or crystal orientation. Combinations of different tile sizes and/or shapes are possible, such as to stagger seams or joints. According to one embodiment, an arrangement of tile sizes and/or shapes seeks to minimize a length of seams or joints between tiles for a given surface area. The seed tiles may include any suitable shape, such as a circle, a triangle, a rectangle, a square, a pentagon, a hexagon, an octagon, a polygon, a rectilinear shape, an arcuate shape, a symmetric shape, an irregular shape, and/or the like.

Positioning the tiles may form a matrix or an array. The matrix may include any suitable number of rows and/or columns, such as 2 by 2, 3 by 3, 4 by 4, 5 by 5, 6 by 6, 7 by 7, 8 by 8, 9 by 9, 10 by 10, 15 by 15, 20 by 20, 50 by 50, 100 by 100, and/or the like. Rectangular and square matrices are within the scope of this invention. Combinations of tiles with the same or different crystal orientations are within the scope of this invention, such as to form a ring or boarder of different crystal orientations around a central portion of a preferred orientation. Checker board tile arrangements are within the scope of this invention, such as to create regular occurring grain boundaries. Seed layers for horizontal installation may be made from tiles sliced generally perpendicular to tiles for seed layers for vertical installation.

Desirably, the positioning minimizes a gap or a space between one or more tiles. The aligned or abutted edges may form a seam. Seam broadly refers to the space between adjacent tiles or edges, such as a line, an elongated plane, a groove, and/or a ridge formed by abutment of edges.

Suitable surface broadly refers to an at least generally planar external portion of a device for preparing the seed layer. The suitable surface may be generally horizontal and/or disposed at any other suitable angle. Desirably, the external surface includes an at least relatively smooth and flat finish. The suitable surface may include any suitable material, such as silica, fused silica, carbon-carbon composite, ceramic, alumina, and/or the like. The suitable surface may include any suitable form, such as a fused silica plate, inside a crucible, on top of a layer of fused silica beads, on top of a layer of fused silica powder, and/or the like. Optionally, the suitable surface may include a release coating applied to it, such as silicon nitride, silicon carbide, and/or the like.

Joining broadly refers to any suitable process or step for two or more pieces or tiles to combine, fuse, weld, sinter, secure, and/or the like. Joining may be based on mechanical principles, chemical principles, material science principles, thermodynamic principles, and/or the like. Desirably, the joining fuses the seam to form a continuous seed layer. The joining may render the seam no longer visible or detectable. Joining may render the individual tiles in a unitary seed layer and/or a monolithic seed layer. The joining may produce a seed layer having the strength and/or mechanical integrity as if it was cast as a single piece. The joining may result in a seed layer that can be handled during casting without breaking during ordinary use. The joining may result in a seed layer that can be reused in multiple casting cycles or batches.

According to one embodiment, the step of joining may include the step of heating the tiles to melt at least a portion of the tiles and close the seams, and the step of cooling the seed layer. Heating the tiles may be by any suitable manner, such as placing in a furnace, placing in an oven, using resistance heaters, using induction heaters, using microwaves, using infrared energy, using ultraviolet energy, using other radiation sources, using other radio frequency sources, using hot air, using other convection sources, using direct contact, using other conduction sources, using plasma torches, using other flame sources, and/or the like. Heating focused or targeted at the seam locations is within the scope of this invention, such as to reduce melting of the remainder of the tiles. In the alternative, heating may include all tiles and/or the entire seed layer.

Melting broadly refers to raising in internal energy or temperature of a substance to or above a melting point of the substance. Silicon has a melting point of 1,414 degrees Celsius. The melting may include any suitable amount, such as at least about 10 percent of a depth of the tiles, at least about 20 percent of a depth of the tiles, at least about 30 percent of a depth of the tiles, at least abut 40 percent of a depth of the tiles, at least about 50 percent of a depth of the tiles, at least about 60 percent of a depth of the tiles, at least about 70 percent of a depth of the tiles, at least about 80 percent of a depth of the tiles, at least about 90 percent of a depth of the tiles, and/or the like.

Closing broadly refers to removing the joint or joining as discussed above. Desirably, the closed seam is no longer detectable, such as with visual examination after sodium etching, either by naked eye or by microscope.

Cooling broadly refers to removing and/or reducing internal energy and/or temperature of a material. Cooling may include any sufficient temperature, such as below a melting point of the tiles and/or to ambient or room conditions. Cooling may be active to a heat sink and/or passive by radiating to ambient surroundings. In the alternative, cooling may be at a controlled rate, such as modulated with heaters.

Cooling the seed layer may be at suitable rate, such as to allow crystal growth and/or reduce thermal stresses on the seed layer. Cooling may be at about 25 degrees Celsius an hour, about 50 degrees Celsius an hour, about 75 degrees Celsius an hour, about 100 degrees Celsius an hour, about 200 degrees Celsius an hour, and/or the like. Cooling may include different rates over different temperature ranges, such as 100 degrees Celsius an hour for all temperatures above about 800 degrees Celsius and 200 degrees an hour for all temperatures below about 800 degrees Celsius.

According to one embodiment, the process may further include the step of repositioning, flipping, or turning over the seed layer with respect to a top side and a bottom side following the step of cooling the seed layer. Turning the seed layer over may allow or provide for melting the former bottom side of the seam and further strengthening the seed layer. The process may also include the step of reheating the seed layer to melt at least a previously unmelted portion of the seed layer and close the seams, and the step of recooling the seed layer.

The step of reheating includes all the characteristics and features discussed above with respect to the initial heating. Desirably, the unmelted portion of the seed layer includes at least a portion of the remaining thickness of the seed layer not melted in the first heating. There may be overlap in the melt steps (heating and reheating), such as to ensure joining of the seams and/or the elimination of voids within the layer. The step of recooling includes all the characteristics and features discussed above with respect to the initial cooling. The first cooling may be to solidify the seed layer and then turn it over while still hot. The second cooling may be to solidify the seed layer and cool it to ambient conditions.

According to one embodiment, the step of joining may include the step of contacting the tiles at both ends of at least one seam with electrodes, and the step of flowing electrical current through the tiles between the electrodes to melt at least a portion of the tiles and close the seams. The process may further include the step of optionally repeating the contacting and the flowing electrical current for each seam in the layer, and the step of cooling the seed layer. The seed layer can be cooled or slowly cooled, such as to allow crystal growth.

Contacting broadly refers to touching or being in sufficient proximity to allow electricity to flow between objects. Electrodes (one anode and one cathode) broadly refer to a device for supplying electrical current to the tiles and/or the seed layer. The electrical current may include direct electric current and/or alternating electric current. The electric current may include any suitable voltage, amperage, power, and/or frequency. The electrodes may include any suitable shape, such as generally cylindrical in form. One or more of the electrodes may be consumable, such as in a manner as a welding rod. In the alternative, the electrodes may be of a suitable durable substance. According to one embodiment, the electrodes may include highly doped silicon.

The electrodes may be located in any suitable position, such as longitudinally at each end of a seam. In the alternative the electrodes may be positioned transverse with respect to a seam. Both electrodes may remain stationary (fixed positions) during the step of flowing the electrical current. In the alternative, at least one electrode may move with respect to the tiles during the step of flowing of the electrical current.

According to one embodiment, the step of joining may include deposition of amorphous silicon to close the seams. Amorphous broadly refers to without a generally crystalline structure. The amorphous silicon can be applied to the seed tiles before being sliced from a block, a brick, a boule and/or the like. The amorphous silicon may coat or cover the tile edges or sides and not generally the tile top or bottom. The block may be sliced into tiles, such as with a saw. In the alternative, the amorphous silicon may be deposited on the tiles, such that excess on a top and/or bottom may be layer removed, such as with plasma etching and/or the like.

The amorphous silicon may be applied or added in any suitable manner, such as conformal plasma deposition and/or the like. The tiles can then be arranged or aligned to form seams as discussed above. The tiles may be compressed or squeezed together to bring the amorphous silicon coatings into intimate contact, such as with pressure.

The process may further include a heating step at a moderate elevated temperature, such as between about 150 degrees Celsius and about 1,000 degrees Celsius, between about 500 degrees Celsius and about 750 degrees Celsius, between about 550 degrees Celsius and about 600 degrees Celsius, and/or the like. The heating duration may be for any suitable length, such as between several minutes and 24 hours. The heating may transform the amorphous silicon to crystalline silicon, such as by solid phase epitaxy. The amorphous silicon may become crystalline at a lower temperature than the melt point of silicon, such as by way of being in contact with the crystalline portion of the seed tile and/or seed layer. The seed layer can be cooled or slowly cooled, such as to allow crystal growth. The heating step may instigate atomic-scale bonding between the tile layers in cases where the amorphous silicon coating does not bridge two tiles. For example, by using standard wafer bonding methods involving highly clean surfaces, appropriate annealing cycles (similar to those described above), and the application of pressure, if needed. The bonding need not be complete across the entire surface to be effective.

Optionally, the seed layer may undergo a high temperature anneal or heat treatment, such as after the solid phase epitaxy and/or a cooling step. The high temperature anneal may include any suitable temperature and/or duration followed by suitable cooling. The temperature may include at least about 800 degrees Celsius, at least about 1,000 degrees Celsius, at least about 1,200 degrees Celsius, at least about 1,400 degrees Celsius, and/or the like. The seed layer can be cooled or slowly cooled, such as to allow crystal growth. Alternately, the sample or some portion thereof may be quenched at very fast cooling rates after flash-lamp or laser annealing of a surface. The cooling rate may include any suitable value, such as at least about 300 degrees Kelvin per second, at least about 500 degrees Kelvin per second, at least about 700 degrees Kelvin per second, and/or the like.

The process may also include the step of tapering one or more sides of the tiles. Tapered sides may generally form a V-shape gap when the tiles are placed or abutted with respect to each other. The tapering may be done to the entire block, such as before slicing the tiles. In the alternative, the tapering may be done to the individual tiles. The tapering may include any suitable angle from vertical, such as about 0.1 degrees, about 0.5 degrees, about 1 degree, about 2 degrees, about 3 degrees, about 4 degrees, about 5 degrees, about 10 degrees, about 15 degrees, about 20 degrees, and/or the like. The gap may be any suitable distance, such as about 0.01 millimeter at the widest point, about 0.05 millimeters at the widest point, about 0.1 millimeters at the widest point, about 0.5 millimeters at the widest point, about 1 millimeter at the widest point, about 1.5 millimeters at the widest point, about 2.0 millimeters at the widest point, about 3.0 millimeters at the widest point, and/the like.

In the alternative, the tapered tiles may be placed with one upward tile and one downward tile with respect to each other, such as to form a seam without a gap and at a suitable angle. The angled seams may include any suitable angle, such as about 1 degree, about 2 degrees, about 3 degrees, about 5 degrees, about 10 degrees, about 20 degrees, about 40 degrees, about 60 degrees, and/or the like.

According to one embodiment, the step of joining may include the step of applying photons to close the seams. Photons may include any suitable wavelength, amplitude, intensity, source, and/or the like. The photons may be applied in any suitable manner, such as by laser welding or flash lamp melting of the silicon or tiles at and/or near the seams. Laser welding broadly refers to application of coherent light produced by light amplification by stimulated emission of radiation. The laser welding may be focused and precise, such as to close the seam. Flash lamp melting or annealing may include applying photons, such as to selected or targeted sections of the seed tiles. The laser and/or the flash lamp may move or travel along or down a length of the seam, such as during the application of photons. In the alternative, the laser and/or the flash lamp may melt or fuse an entire length of a seam at substantially the same time.

The seed layer may be flipped or turned over such as to allow applying photons to a bottom or opposite side of the seed layer. The applied photons may melt any suitable portion of the depth of the tiles as discussed above.

Any and/or all of the steps disclosed herein may be completed or accomplished while under an inert atmosphere, such as to prevent material loss, seed layer contamination, and/or the like. Suitable inert atmospheres may include vacuum, argon, nitrogen, helium, xenon, and/or the like. In the alternative, one or more steps of the process may be completed or accomplished while under air, oxygen, other suitable oxidizing environment, and/or the like.

Any and/or all of the steps disclosed herein may include cooling, solidification, and/or crystallization, such as following one or more steps melting or fusing a portion of the tiles into the seed layer.

The seed layer may be trimmed or shaped in any suitable manner, such as to square up the seed layer for use after manufacturing. More than one seed layer may be laminated on top of another seed layer, such as to increase the thickness. Any of the methods described herein for joining tiles may be applied with respect to layers or strata. Desirably, the layers may be offset or staggered, such as to minimize overlapping seams and increase strength. Desirably, but not necessarily, all layers can have the same crystal structure or orientation with respect to each other.

According to one embodiment, the step of joining may include the step of layer deposition to close the seams. The layer deposition may include any suitable process or technique, such as oxidation, chemical vapor deposition, liquid phase solution deposition, plasma-enhanced deposition, molecular beam epitaxy, and/or the like.

Combinations of any of the joining steps or methods disclosed herein are within the scope of this invention. The combined joining techniques may be applied simultaneously and/or sequentially.

According to one embodiment, the layer deposition may include epitaxial deposition at a suitable temperature, such as between about 500 degrees Celsius and about 1,400 degrees Celsius, between about 700 degrees Celsius and about 1,100 degrees Celsius, and/or the like. Epitaxy broadly refers to growth on a crystalline substrate of a crystalline substance that follows and/or mimics the orientation of the substrate.

As discussed above, the process may include tapering one or more sides of the tiles. Any and/or all of the steps disclosed herein may be completed or accomplished with tiles having one or more polished sides. Optionally, any and/or all processes described herein may further include the step of polishing one or more sides of the tiles. Well polished sides are generally desirable to minimize surface roughness and improve the intimacy of the matching tile surfaces while eliminating harmful damage and/or contamination from sawing processes.

The tiles may include any suitable form or crystal orientation, such as amorphous silicon, multicrystalline silicon, near multicrystalline silicon, geometric multicrystalline silicon, monocrystalline silicon, and/or the like. The tiles may be arranged or aligned to have coincident crystalline orientations. In the alternative, the tiles may be arranged or aligned to have differing crystal orientations, such as to form seams resulting in any suitable specific grain boundaries. According to one embodiment, the specific grain boundaries may include low-energy grain boundaries, such as $\Sigma 3$ grain boundaries, $\Sigma 5$ grain boundaries, $\Sigma 9$ grain boundaries, random high angle grain boundaries (no specific orientation relationship), and/or the like The seed layer may include any suitable form or crystal orientation, such as amorphous silicon, multicrystalline silicon, near multicrystalline silicon, geometric multicrystalline silicon, monocrystalline silicon, and/or the like. The seed layer may be arranged or aligned to have coincident crystalline orientations. In the alternative, the seed layer may be arranged or aligned to have differing crystal orientations, such as to form seams resulting in specific grain boundaries.

In another melting embodiment, a layer of thin tiles may be closely abutted on a suitable surface. Thin tiles may include any suitable thickness, such as between about 1 millimeter thick to about 5 millimeters thick, between about 2 millimeters thick to about 4 millimeters thick, about 2 millimeters thick, and/or the like. While the bottom layer could be arbitrarily thick, excessive thickness is not desirable since it is a sacrificial layer that will be melted away in the first use. A second layer of thin tiles and/or thicker tiles can be placed on top of the first layer, such as with a gap between every tile and a slight lateral offset of the upper layer with respect to the bottom layer. Thicker tiles may include any suitable thickness, such as between about 1.0 millimeters thick to about 50 millimeters, between about 5 millimeters thick to about 30 millimeters thick, about 20 millimeters thick, and/or the like. The gap may be any suitable size, such as between about 0.1 millimeters to about 5 millimeters, between about 1 millimeters and about 3 millimeters, about 2 millimeters, and/or the like. Again, the second layer may also be arbitrarily thick, but the best targets are disclosed here, not too thin so as to make the process difficult to control, and not too thick so as to waste single crystal silicon and decrease overall throughput from a single cast.

Desirably, the lower seams do not line up with the upper seams. Liquid silicon can then be introduced into the gaps by one of several methods. The solid silicon may be melted elsewhere and poured into the gaps, a piece of solid feedstock may be placed on the upper seed layer and melted, a thin upper portion of the thick tiles may be melted and allowed to flow into the gaps, and/or the like. Whatever the method, the assembly can then be cooled by extracting heat through the lower layer of tiles to solidify the assembly. After solidification, the fused seed layer may be cooled down. For its first use as a seed layer in a casting, the fused seed may be trimmed, and the seed layer may also be flipped over such that the thin tiles are melted away in the next cycle. Preferably, these melting techniques are accomplished within a controlled, inert atmosphere while minimizing exposure to impurities.

According to one embodiment, the arrangement of tiles may include different heights, such as a thick tile and a thin tile. A layer of thick tiles may be positioned with a gap of constant width separating every tile while a layer of thin tiles may be positioned close-packed adjacent the thick layer. A height of the thick tiles to the thin tiles may include any suitable ratio, such as at least about 1.2:1, at least about 1.5:1, at least about 1.75:1, at least about 2:1, at least about 4:1, and/or the like.

According to one embodiment, the arrangement may include where alternating rows of tiles can be offset slightly from one another while being fully abutted, such as to prevent the formation of a four-corner seam junction.

According to one embodiment, this invention may include a seed layer made by any and/or all of the processes and steps described herein, such as the step of the step of positioning tiles with aligned edges to form seams on a suitable surface, and the step of joining the tiles at the seams to form a seed layer.

According to one embodiment, the seed layer may include a rectilinear shape of at least 500 millimeters in width and/or length. The seed layer may include monocrystalline silicon, and/or any other suitable material.

According to one embodiment, this invention may include a seed layer for casting silicon suitable for use in solar cells or solar modules. The seed layer may include a rectilinear shape of at least about 500 millimeters in width and length. The seed layer may include monocrystalline silicon and/or any other suitable material. In the alternative, the seed layer may include a size of about 600 millimeters to about 1,000 millimeters in length and width. The seed layer may include a thickness of between about 2 millimeters to about 50 millimeters.

As used herein the terms "having", "comprising", and "including" are open and inclusive expressions. Alternately, the term "consisting" is a closed and exclusive expression. Should any ambiguity exist in construing any term in the claims or the specification, the intent of the drafter is toward open and inclusive expressions.

Regarding an order, number, sequence and/or limit of repetition for steps in a method or process, the drafter intends no implied order, number, sequence and/or limit of repetition for the steps to the scope of the invention, unless explicitly provided.

It will be apparent to those skilled in the art that various modifications and variations can be made in the disclosed structures and methods without departing from the scope or spirit of the invention. Particularly, descriptions of any one embodiment can be freely combined with descriptions or other embodiments to result in combinations and/or variations of two or more elements or limitations. Other embodiments of the invention will be apparent to those skilled in the art from consideration of the specification and practice of the invention disclosed herein. It is intended that the specification be considered exemplary only, with a true scope and spirit of the invention being indicated by the following claims.

What is claimed is:

1. A process for manufacturing silicon seed layers suitable for use in the manufacture of solar cells or solar modules, the process comprising:
    positioning tiles with aligned edges to form seams on a suitable surface;
    joining the tiles at the seams to form a seed layer;
    heating the tiles to partially melt at least a portion of the tiles and close the seams;
    cooling the seed layer;
    positioning the seed layer with respect to a top side and a bottom side of the seed layer following cooling the seed layer;
    reheating the seed layer to melt at least a previously unmelted portion of the seed layer and close the seams; and
    recooling the seed layer.

2. The process of claim 1, wherein the cooling comprises a rate of cooling of about 100 degrees Celsius an hour.

3. The process of claim 1, wherein the joining comprises:
    contacting the tiles at both ends of at least one seam with electrodes;
    flowing electrical current through the tiles between the electrodes to melt at least a portion of the tiles and close the seams;
    optionally repeating the contacting and the flowing for each seam in the layer; and cooling the seed layer.

4. The process of claim 3, wherein the electrodes remain stationary with respect to the tiles during the flowing electrical current.

5. The process of claim 3, wherein at least one electrode moves with respect to the tiles during the flowing of the electrical current.

6. The process of claim 3, wherein the electrodes comprise highly doped silicon.

7. The process of claim 1, wherein the joining comprises plasma deposition of amorphous silicon to close the seams.

8. The process of claim 7, wherein the deposition of amorphous silicon comprises conformal plasma deposition.

9. The process of claim 7, further comprising heating the seed layer to between about 500 degrees Celsius and about 750 degrees Celsius.

10. The process of claim 9, wherein the heating transforms the amorphous silicon to crystalline silicon.

11. The process of claim 7, further comprising a high temperature anneal or heat treatment.

12. The process of claim 7, further comprising tapering one or more sides of the tiles.

13. The process of claim 1, wherein the joining comprises applying photons to close the seams.

14. The process of claim 13, wherein the applying photons comprise laser welding or flash lamp melting of the silicon at the seams.

15. The process of claim 1, wherein the joining comprises layer deposition to close the seams.

16. The process of claim 15, wherein the layer deposition comprises oxidation, chemical vapor deposition, liquid phase solution deposition, plasma-enhanced deposition, molecular beam epitaxy or combinations thereof.

17. The process of claim 15, wherein the layer deposition comprises epitaxial deposition at a temperature of between about 700 degrees Celsius and about 1,100 degrees Celsius.

18. The process of claim 15 further comprising tapering one or more sides of the tiles.

19. The process of claim 1, further comprising polishing one or more sides of the tiles.

20. The process of claim 1, wherein a layer of thick tiles is positioned with a gap of constant width separating every tile while a layer of thin tiles is positioned close-packed adjacent the thick layer.

21. The process of claim 20, further comprising:
    introducing molten silicon to fill the gaps, and cooling of the seed layer through the thin layer of tiles.

22. The process of claim 1, where alternating rows of tiles are offset slightly from one another while being fully abutted, to prevent the formation of a four-corner seam junction.

23. The process of claim 1, wherein the tiles comprise monocrystalline material.

24. The process of claim 1, wherein the tiles are aligned to have coincident crystalline orientations.

25. The process of claim 1, wherein the tiles are aligned to have differing crystal orientations, and form seams resulting in specific grain boundaries.

26. The process of claim 25, wherein the specific grain boundaries comprise stable low-energy grain boundaries.

* * * * *